US005760664A

United States Patent [19]

Allen

[11] Patent Number: 5,760,664
[45] Date of Patent: Jun. 2, 1998

[54] ACOUSTIC WAVE FILTER WITH DOUBLE REFLECTIVE GRATINGS AND METHOD FOR PRODUCING THE SAME

[75] Inventor: Donald Allen, Gilbert, Ariz.

[73] Assignee: Motorola Inc., Schaumburg, Ill.

[21] Appl. No.: 756,867

[22] Filed: Nov. 26, 1996

[51] Int. Cl.$^6$ .................. H03H 9/25; H03H 9/64
[52] U.S. Cl. ............. 333/194; 333/195; 310/313 D
[58] Field of Search ............................ 333/193–196; 310/313 R, 313 B, 313 C, 313 D

[56] References Cited

U.S. PATENT DOCUMENTS

| 4,672,255 | 6/1987 | Suzuki et al. | 310/313 A |
|---|---|---|---|
| 5,296,824 | 3/1994 | Cho et al. | 333/193 |
| 5,351,022 | 9/1994 | Ruile et al. | 333/195 |
| 5,561,408 | 10/1996 | Yamamoto et al. | 333/194 |

FOREIGN PATENT DOCUMENTS

| 56-122217 A | 9/1981 | Japan | 333/195 |
|---|---|---|---|
| 4-275711 A | 10/1992 | Japan | 333/194 |

*Primary Examiner*—Robert Pascal
*Assistant Examiner*—Barbara Summons
*Attorney, Agent, or Firm*—Brian M. Mancini

[57] ABSTRACT

An acoustic wave resonator is provided on a substrate of 45° X-cut, Z-propagating lithium tetraborate. The resonator includes an inner and an outer set of reflective gratings. The inner set of reflective gratings is separated from the transducer of the resonator by a set of first gaps having a synchronous coupling value of $n\lambda/2$. The outer set of reflective gratings is separated from the inner set of reflective gratings by a set of second gaps having a peak coupling value of $(4m+1)\lambda/8$. This configuration of the resonator produces a wide bandwidth frequency response substantially free of spurious frequency modes and having a good shape factor.

27 Claims, 4 Drawing Sheets

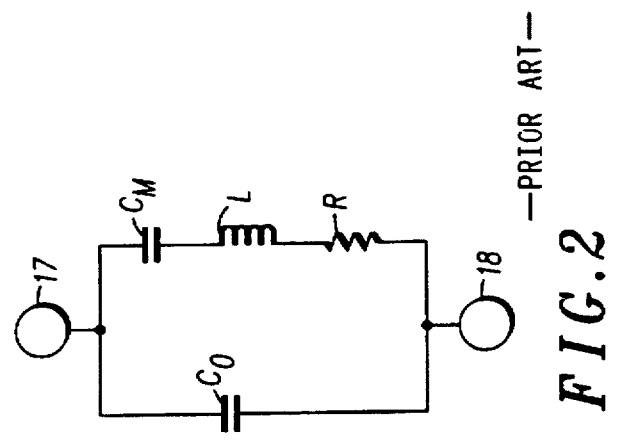
FIG.2 —PRIOR ART—
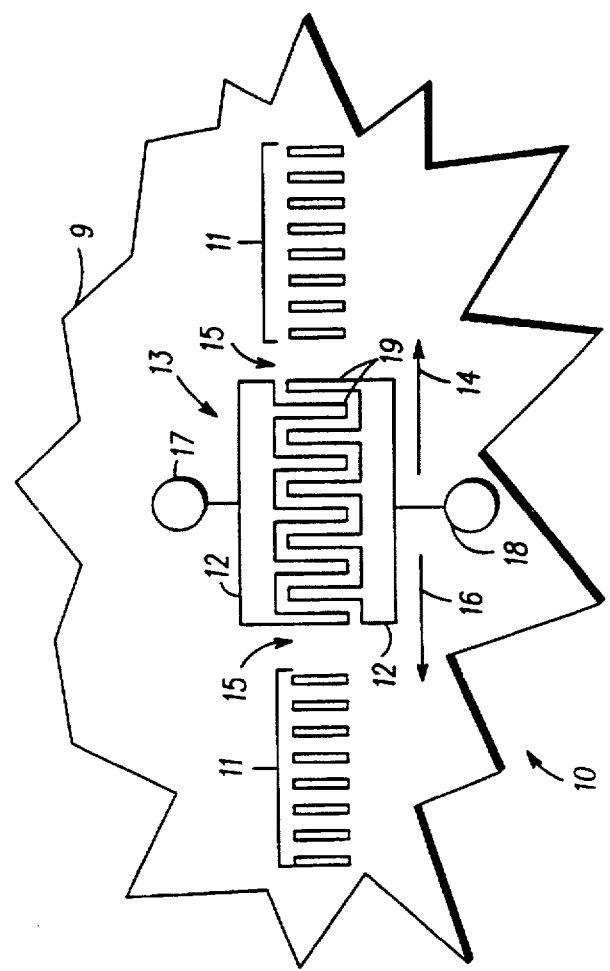
FIG.1 —PRIOR ART—
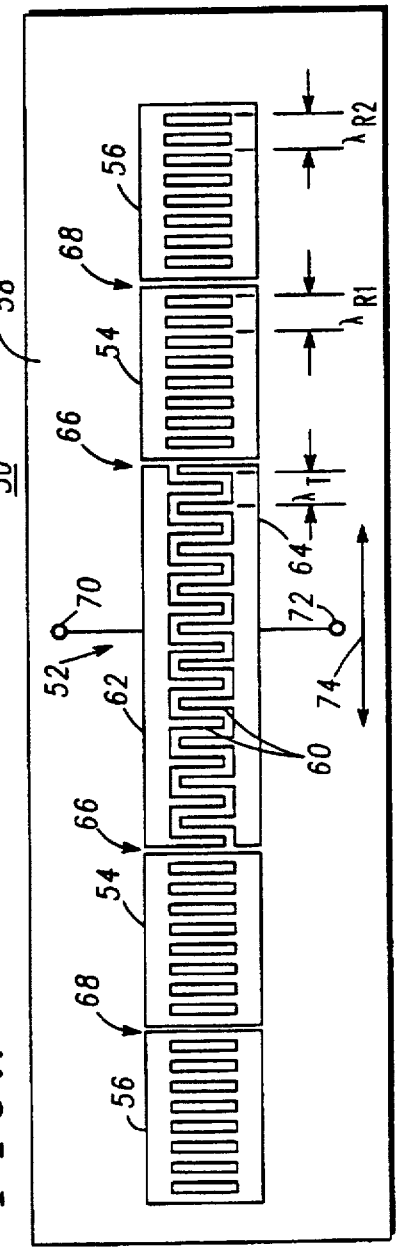
FIG.3

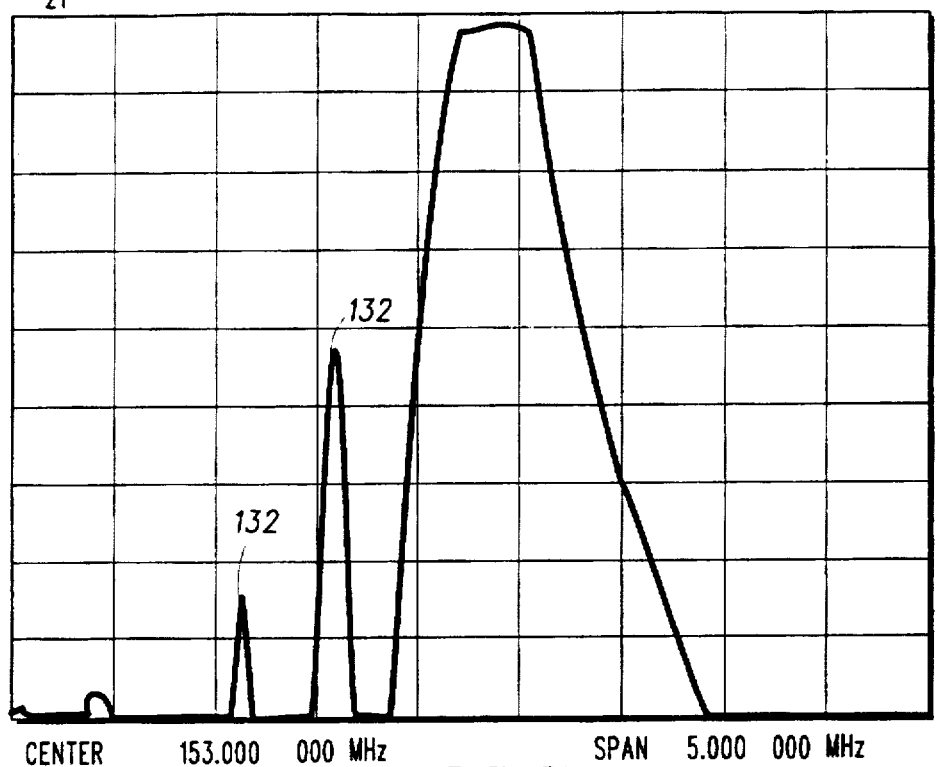
FIG.7 —PRIOR ART—
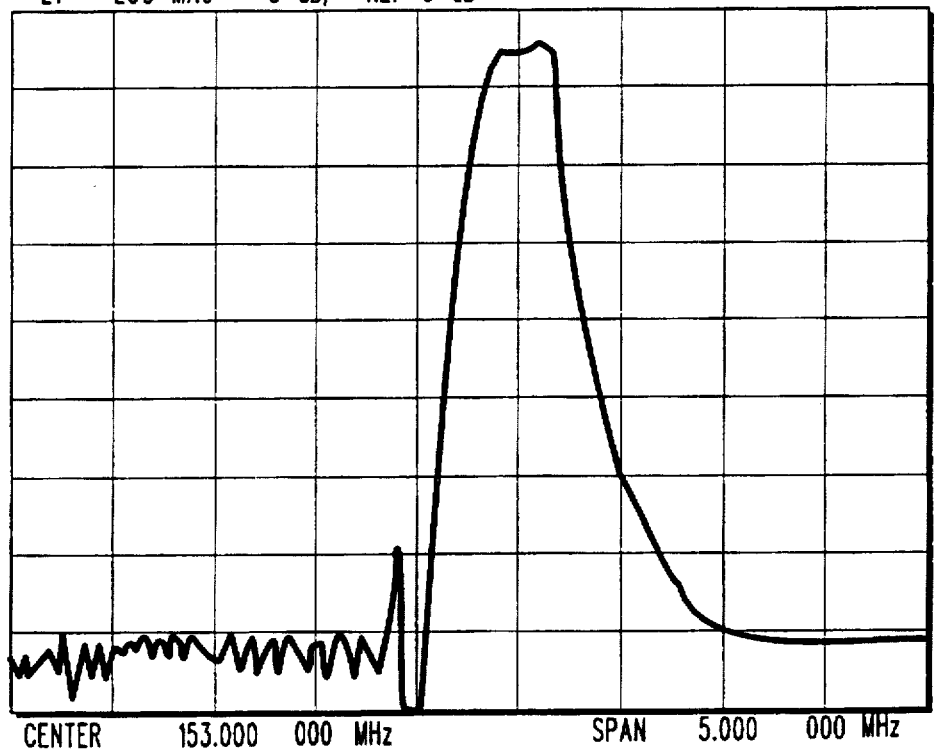
FIG.8

ACOUSTIC WAVE FILTER WITH DOUBLE REFLECTIVE GRATINGS AND METHOD FOR PRODUCING THE SAME

FIELD OF THE INVENTION

The present invention relates in general to surface acoustic wave filters, in particular to leaky and surface skimming bulk wave filters and Rayleigh and surface wave filters, and more particularly to acoustic filters fabricated with double reflective gratings.

BACKGROUND OF THE INVENTION

There is an ongoing need for component miniaturization in radio wave communication devices. For example, smaller and more efficient components are needed for light-weight, hand-portable cellular telephones, wireless local area networks for linking computer systems within office buildings in a readily reconfigurable fashion, wristwatch- and credit-card-sized paging apparatus and other devices for promoting rapid, efficient and flexible voice and data communication.

Filters are needed for a variety of such communications applications wherein small size, light weight and high performance are simultaneously required. Increasing numbers of products seek to employ fixed spectral resources, often to achieve tasks not previously envisioned. Examples include cellular telephones, inter- and intra-facility computer-computer and/or computer-ancillary equipment linkages as well as a host of other, increasingly complex inter-personal and/or -equipment information sharing requirements. The desire to render increasingly complicated communications nodes portable and even hand-held and/or -portable and/or pocket-sized places extreme demands on filtering technology in the context of increasingly crowded radio frequency resources.

Acoustic wave filters provide filters meeting stringent performance requirements which are (i) extremely robust, (ii) readily mass produced, (iii) adjustment-free over the life of the unit and which (iv) sharply increase the performance-to-size ratio achievable in the frequency range extending from a few tens of megahertz to about several gigahertz. However, need for low passband insertion loss simultaneously coupled with demand for high shape factor and high stopband attenuation pose filter design and performance requirements not easily met by a single acoustic wave filter alone.

Acoustic wave filters formed from groupings of resonators employ generally periodic arrays of electrodes configured to provide discrete elements such as transducers (for converting electrical to mechanical energy and vice versa), reflectors (for reversing the direction of propagation of an acoustic wave) and gaps for separating transducers and reflectors. These elements are grouped in a generally in-line configuration (e.g., reflector, gap, transducer, gap, reflector) along a principal axis of acoustic wave propagation on a suitable substrate material, with the entire array providing an electrical filtering function associated with the electrical port(s) of the individual transducer(s) and/or the composite filter. Previous surface acoustic wave (SAW) filters are of a two-transducer, transversal design on a single crystal ST-cut quartz substrate. These filters typically display a 5 to 7 dB insertion loss.

More recently, SAW filters include both in-line and transversely coupled resonator filters. A drawback of the resonator type of filters can often times be spurious frequency flybacks in the rejection band(s) of these designs. Flybacks are commonly controlled by providing reflectors of a lower frequency than that of the resonator. This has been done by increasing the periodicity of the reflector electrodes from 3000 to 5000 ppm over the periodicity of the resonator electrodes. However, this requires a high degree of etching and masking accuracy, which is difficult to control.

What is needed is an acoustic filter configuration/design methodology providing flexible bandwidth, suitable out-of-band rejection and low in-band insertion loss, drift-free performance, reduced spurious frequencies and realizable in compact, robust and desirably in monolithic form.

What is needed is an apparatus comprising acoustic wave filters having electrical performance characteristics that are less degraded by the quality factors of the individual resonators comprising the filter, even when implemented on high coupling coefficient substrates, and a method for making same.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference characters refer to similar items throughout the figures, and:

FIG. 1 is a simplified plan view showing a metallization pattern of a prior art acoustic wave resonator with reflectors;

FIG. 2 is a schematic diagram of a simplified equivalent circuit for the resonator of FIG. 1;

FIG. 3 is a simplified plan view of an acoustic wave resonator with double reflective gratings, in accordance with the present invention;

FIG. 7 is a measured frequency response of a prior art 4-pole acoustic wave filter having only synchronous or peak coupling; and FIG. 8 is a measured frequency response of the cascaded filters of FIG. 5, in accordance with the present invention.

Figure 4:
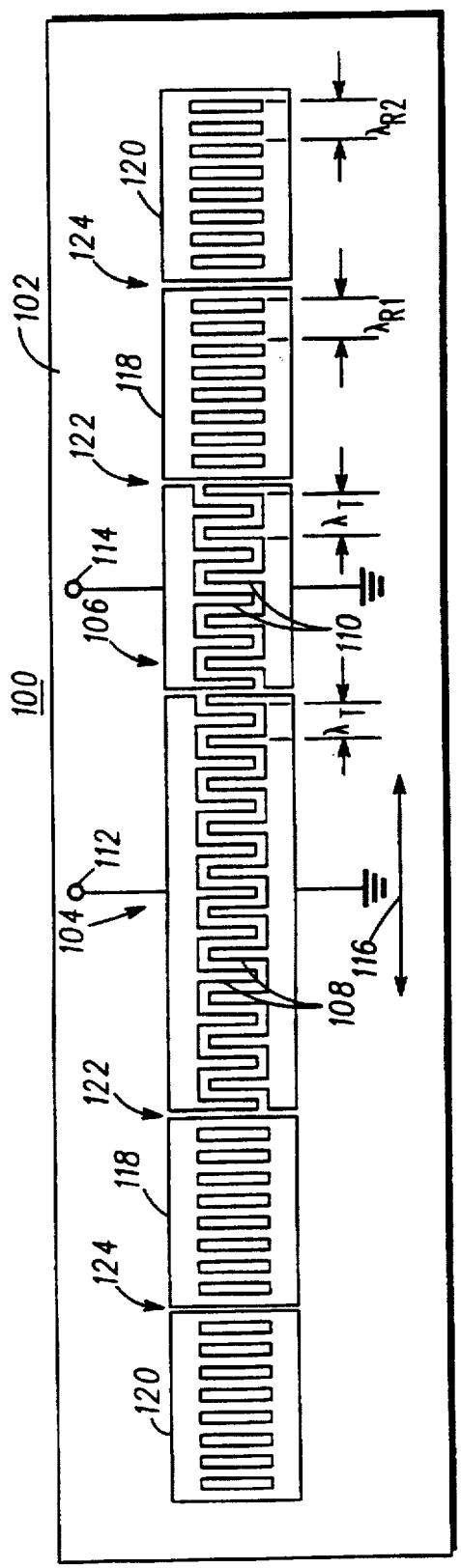
FIG. 4 is a simplified plan view of an acoustic wave filter with double reflective gratings employing both synchronous and peak coupling, in accordance with the present invention.

The exemplification set out herein illustrates a preferred embodiment of the invention in one form thereof, and such exemplification is not intended to be construed as limiting in any manner.

DETAILED DESCRIPTION OF THE PREFERRED EMBODIMENT

FIG. 1 is a simplified plan view of a prior art acoustic wave resonator 10 including an acoustic wave transducer 13 comprising interdigitated electrodes 19 (also referred to herein an "fingers", "finger electrodes", etc.) coupled alternately to a first terminal 17 or a second terminal 18 via respective bus bars 12. The resonator 10 optionally includes reflectors 11 separated from the transducer 13 by gaps 15 and disposed to either side of the transducer 13 in principal directions 14, 16 of acoustic wave propagation. The reflectors 11 typically comprise metal electrodes analogous to electrodes 19 that are either electrically isolated one from another or coupled to only one of the bus bars within a particular reflector 11 or which may be electrically connected together within a particular reflector 11 but not electrically connected to features outside of that particular reflector 11.

The electrodes 19 typically are periodic and define a particular acoustic wavelength at which the transducer 13 exhibits a characteristic acoustic center frequency together with a center frequency wavelength for the acoustic energy transduced in response to electrical stimulation of an appropriate frequency applied via terminals 17, 18. The electrodes 19 are usefully one-fourth of this center frequency wavelength wide, i.e., measured along directions in accordance with design principles and performance objectives for the resonator 10. The electrodes are disposed on one-half acoustic wavelength centers, usually alternately coupled to their associated bus bars 12, respectively.

Electrical stimulation at an appropriate frequency supplied from electrical terminals 17, 18 to bus bars 12 and thence to interdigitated or interleaved electrodes 19 results in acoustic waves being generated within transducer 13. Similarly, acoustic waves of an appropriate frequency impinging upon electrodes 19 result in electrical signals being manifested at terminals 17, 18. As used herein, the term "acoustic wavelength" is taken to mean an acoustic wavelength at the filter center frequency, i.e., in the nominal center of the filter passband.

The reflectors 11 typically include electrodes or other reflective structures one-fourth of this wavelength wide, i.e., measured along directions 14, 16, because electrodes of this width tend to be reflective. However, other widths providing suitable reflection characteristics may be employed and this width may be chosen to accommodate the reflection characteristics of the materials employed for the resonator 10, including a substrate 9.

The resonator 10 is typically fabricated on a polished substrate 9 by depositing and patterning a thin metal film, often comprising aluminum, in a thickness ranging from about 500 Å to about 6000 Å thick, by techniques similar to those employed in integrated circuit manufacturing.

FIG. 2 is a schematic diagram of a simplified equivalent circuit for the resonator 10 of FIG. 1 which is conveniently modeled as a series RLC circuit (e.g., a resistor of resistance R having one lead coupled to terminal 18 of FIG. 1, in series with an inductor having inductance L, in turn coupled in series with a capacitor having capacitance $C_m$ and having a second lead coupled to terminal 17) bridged by a capacitor having capacitance $C_o$ (i.e., coupled from terminal 17 to terminal 18). Values for components $C_o$, $C_m$, L, R are found from Eqs. 1–3 (infra), the geometry of transducer 13 and relevant material constants. R may be usefully estimated as zero (i.e., ignored) or may be modeled from empirical data. Values of a few Ohms are often encountered in practice. R represents bulk wave radiation, acoustic propagation away from the receiving transducer, metal resistivity, diffraction effects and other losses encountered in acoustic resonant elements. Static capacitance $C_o$ is found from:

$$C_o = C_e NW \quad (1)$$

where $C_e$ is a material parameter describing capacitance per finger pair per cm (tabulated for many materials in a variety of textbooks), N represents the number of transducer finger pairs (e.g., pairs of electrodes 19 in transducer 13, FIG. 1) and W represents the overlap of electrodes 19 or beamwidth in cm.

Motional capacitance $C_m$ is related to static capacitance $C_o$ by:

$$C_m = \frac{8k^2 C_o}{\pi^2} \quad (2)$$

where $k^2$ represents the electromechanical coupling coefficient (tabulated in a variety of textbooks related to piezoelectric materials). Motional inductance L is given by:

$$L = \frac{1}{C_m \omega_r^2} \quad (3)$$

where $\omega_r$ represents the radian transducer resonant frequency.

Admittance Y measured between terminals 17, 18 of FIG. 1 is:

$$Y = j\omega C_o + \frac{1}{R + j(\omega L - (1/\omega C_m))} \quad (4)$$

Admittance Y has resonant frequency $\omega_r$, usually close to and slightly lower than the acoustic center frequency (approximately the sound velocity divided by the acoustic wavelength associated with the periodicity of electrodes 19 of the transducer 13):

$$\omega_r = \frac{1}{\sqrt{LC_m}} \quad (5)$$

and antiresonant frequency $\omega_a$:

$$\omega_a = \omega_r \sqrt{1 + C_m/C_o} \quad (6)$$

or $$\omega_a = \omega_r \sqrt{1 + 8k^2/\pi^2} \quad (7)$$

For a given transducer 13, antiresonant frequency $\omega_a$ is always greater than resonant frequency $\omega_r$ by a ratio determined by electromechanical coupling coefficient $k^2$ (Eq. 7). For extremely high coupling coefficients (e.g., $k^2 > 5\%$), an appropriate coupling coefficient value may need to be empirically determined because the assumptions employed in relating physical parameters (e.g., acoustic wavelength, radiation conductance, $\omega_a$, $\omega_r$, etc.) to each other and to acoustic center frequencies are not entirely valid. In accordance with the present invention, coupling coefficients are generally usefully greater than 0.1%, more usefully greater than 1%, generally desirably greater than 5%, more desirably greater than 7% and preferably greater than 10%.

In traditional acoustic filters employing ST-cut quartz resonant elements, electromechanical coupling coefficient $k^2$ is typically much smaller than 0.5%, limiting the fractional bandwidth (bandwidth divided by center frequency) achievable for such filters to very small values. In the present invention, although ST-cut quartz may be utilized, it is preferable to use much higher coupling coefficient materials (e.g., $LiNbO_3$, $LiTaO_3$, etc.) which provide much greater spread between resonant and antiresonant frequencies. For example, 64° $LiNbO_3$ provides a coupling coefficient in the range of from 9% to 13% (nominally about 10.5%), 41° $LiNbO_3$ provides coupling coefficients in the range from 15–25% (nominally about 17%) and 36° $LiTaO_3$ provides coupling coefficients in the range from 6.5–8% (nominally about 7.5%). This increased frequency spread in turn allows greater design freedom.

The acoustic filter of the present invention is a longitudinal (in-line) resonator design with a novel double reflective grating structure resulting in an insertion loss of as low as 1.75 dB. Additionally, the shape factor, defined as the rejection bandwidth divided by the passband width, is smaller and thus preferred over previous designs. Preferably, the present invention utilizes a substrate of lithium tetraborate due to its high coupling coefficient and zero first order temperature response. A high coupling coefficient translates into improved insertion loss with a wide bandwidth and smaller device size. A flat temperature response provides for stable radio performance over changes in temperature.

Generally, the present invention provides a method and apparatus for improving shape factor, insertion loss and temperature performance in acoustic wave (e.g., SAW, surface skimming bulk wave, leaky wave etc.) filters fabricated on high electrical coupling coefficient substrates. The present invention may be more fully understood with reference to FIG. 3, which provides a simplified plan view of an acoustic wave resonator 50, in accordance with the present invention. The acoustic wave resonator 50 comprises at least one transducer 52, a pair of inner reflective gratings 54 and a pair of outer reflective gratings 56, all collectively disposed in an in-line configuration along a preferred axis of a piezoelectric substrate 58 and on a suitably-prepared, preferably polished, upper surface thereof.

The pair of inner reflective gratings 54 are disposed on either side of the transducer 52 along the preferred axis and are separated from the transducer 52 by a first gap 66. The pair of outer reflective gratings 56 are disposed on either side of the combination of the transducer 52 and pair of first reflective gratings 54 along the preferred axis and are separated from the inner reflective gratings 54 by a second gap 68.

Typically, the transducer 52 and reflective gratings 54, 56 comprise interdigitated electrodes or fingers having a width of about one-fourth of a wavelength. However, it will be appreciated that other arrangements are possible and in some applications are preferred. The reflective gratings 54, 56 include electrodes of about one-fourth of this wavelength wide because electrodes of this width tend to be reflective. However, other widths providing suitable reflection characteristics may be usefully employed and this width may be chosen to accommodate the reflection characteristics of the materials employed for the resonator 50, including the substrate 58.

The transducer 52 comprises a series of periodically disposed interdigitated electrodes 60 of about one-fourth of an acoustic wavelength in width and gaps of about one-fourth of an acoustic wavelength therebetween, the electrodes 60 being disposed to have about one-half acoustic wavelength centers. The electrodes 60 are alternately coupled to their associated bus bars 62, 64, respectively, although other arrangements are possible and useful. The respective bus bars 62, 64 are coupled to corresponding electrical terminals 70, 72. When electrically energized via the terminals 70, 72 through the bus bars 62, 64, the electrodes 60 generate an acoustic wave which propagates in a direction of propagation 74 along the preferred axis substantially perpendicular to the interdigitated electrodes 60.

The acoustic wave in the transducer 52 has a characteristic periodicity and therefore a characteristic wavelength $\lambda_T$. The inner reflective gratings 54 have a characteristic periodicity and therefore a characteristic wavelength $\lambda_{R1}$ while the outer reflective gratings 56 have a characteristic periodicity and therefore a characteristic wavelength $\lambda_{R2}$. Preferably, the periodicity and characteristic wavelengths of the transducer 52, inner reflective gratings 54, and outer reflective gratings 56 are all substantially the same with the predetermined spacings of the first and second gaps 66, 68 providing the performance enhancements of the present invention.

The gaps between transducers and reflective gratings, sometimes referred to as delays or spacings, are critical to the present invention. In all cases herein, delay, spacing or gap is defined as the distance between adjacent electrode edges, e.g. outer edge of last transducer electrode to inner edge of first grating electrode. The delay or spacing values for SAW filters of the in-line resonant type, employing one-quarter wavelength wide electrodes, is typically measured as a percentage of wavelength or as a portion of $2\pi$ radians. In conventional designs, the gap between transducers and reflective gratings is normally set to $n\pi/2$ radians (synchronous coupling). The present invention advantageously provides a second reflective grating being peak coupled, i.e. shifted one-eighth wavelength from synchronous coupling. This new configuration controls spurious frequency modes by an entirely new technique, namely splitting the conventional reflector to create inner and outer reflective gratings, and most importantly, creating a gap therebetween, the inner grating being synchronously coupled and the outer grating being peak coupled.

In particular, the first gap 66 between the inner reflective gratings 54 and the transducer 52 is chosen to provide synchronous coupling, i.e., the periodicity between the transducer 52 and the inner reflective gratings 54 is preserved. This is done by setting the first gaps to be about $\lambda/2$ in width, although the first gap 66 can be set to be any integer multiple of $n\lambda/2$ in width where n=1, 2, 3, etc.. In this case, the inner reflective gratings and the transducer 52 serve to produce a resonant cavity having a standing wave resonant mode.

A novel aspect of the present invention is to provide outer reflective gratings 56 and to choose the second gap 68 between the outer reflective gratings 56 and the inner reflective gratings 54 to provide peak coupling, i.e. shifting the periodicity between the inner and outer reflective gratings 54, 56 by about $\lambda/8$. In particular, the second gap 68 is set to be about $(4m+1)\lambda/8$ in width where m=0, 1, 2, etc.. In other words, the second gap 68 is set to be any one of: $\lambda/8$, $5\lambda/8$, $9\lambda/8$, etc.. Preferably, the second gap 68 is set to $5\lambda/8$. The introduction of the peak coupled outer reflective gratings 56 provides a second resonant mode within the cavity serving to broaden the bandwidth of the resonator 50. Further the peak coupled outer reflective gratings 56 serve to substantially reduce out-of-band spurious frequency modes in the resonator 50.

The advantage of the present invention is to effectively split the synchronously-coupled single reflectors of prior art resonators into inner and outer reflective gratings being synchronously and peak coupled, respectively, in accordance with the present invention. By providing both types of coupling within a single resonator, the present invention advantageously controls undesirable spurious frequencies in an electrical frequency response curve of the resonator. Also, the different couplings broadens the passband response of the invention.

In an alternative embodiment, the periodicities and wavelengths of the transducer 52, inner reflective gratings 54, and outer reflective gratings 56 are varied while maintaining constant gaps 66, 68. For example, the spacings of the electrodes in the gratings 54, 56 may be raised or lower slightly from the spacings of the electrodes 60 of the transducer. This changes the operating frequency of the gratings slightly which broadens the frequency response of the device in addition to minimizing the spurious frequency modes of the invention.

In a second alternative embodiment, the periodicities and wavelengths of the transducer 52, inner reflective gratings 54, and outer reflective gratings 56 are varied along with the gaps 66, 68 as stated in the preferred embodiment above. This advantageously provides even greater out-of-band spurious frequency control.

The resonator 50 may be constructed on suitably-prepared substrates such as ST-cut quartz, 41° rotated Y-cut X-propagating LiNbO$_3$, 64° rotated Y-cut X-propagating LiNbO$_3$, 36° rotated Y-cut X-propagating LiTaO$_3$, and 45° rotated X-cut Z-propagating Li$_2$B$_4$O$_7$ (lithium tetraborate). Preferably, the resonator 50 is constructed on a polished substrate of 45° rotated X-cut Z-propagating Li$_2$B$_4$O$_7$ (lithium tetraborate).

The present invention is particularly useful when low insertion loss is required together with high passband width, for which higher electromechanical coupling coefficient substrates are particularly well suited. In addition, the particular selection of lithium tetraborate provides good temperature characteristics, similar to that of ST-cut quartz, while providing a much higher coupling coefficient than ST-cut quartz. Further, lithium tetraborate devices provide higher reflectivity than ST-cut quartz which contributes to providing a wider bandwidth device for a given sized resonator.

FIG. 4 is a simplified plan view of a 2-pole in-line acoustic wave filter 100 having synchronous coupling between transducers and inner gratings and peak coupling between inner and outer gratings; in accordance with the present invention. The filter includes a piezoelectric substrate 102 having an upper surface. The filter 100 includes an input acoustic transducer 104 and an output acoustic transducer 106 each including a respective plurality of interdigitated electrodes 108, 110 disposed on the upper surface of the substrate 102. Each of the electrodes 108, 110 have a width of about $\lambda/4$ acoustic wavelengths and are separated from one another by a gap of about $\lambda/4$ acoustic wavelengths. The respective input and output transducers 104, 106 have corresponding electrical terminals 112, 114.

When electrically energized via the terminal 112 the interdigitated electrodes 108 of the input transducer 104 generate an acoustic wave which propagates in a direction of propagation 116 substantially perpendicular to the electrodes 108. The output transducer 106 is synchronously coupled with the input transducer 104 in the direction of propagation 116. Therefore, the acoustic wave propagated by the input transducer 104 impinges on the electrodes 110 of the output transducer 106. When acoustically energized by an acoustic wave substantially in the direction of propagation 116 the interdigitated electrodes 110 of the output transducer 106 generate an electrical output signal at the terminal 114 of the output transducer 106.

The filter 100 includes a pair of inner reflective gratings 118 disposed on either side of the transducers 104, 106 in the direction of propagation 116, the inner reflective gratings 118 are synchronously coupled with the transducers 104, 106 to define a resonant cavity and support a acoustic standing wave (resonant mode) therebetween. The filter also includes a pair of outer reflective gratings 120 disposed on either side of a combination of the transducers 104, 106 and the pair of inner reflective gratings 118 in the direction of propagation 116. The outer reflective gratings 120 are peak coupled with the combination of the transducers 104, 106 and the pair of inner reflective gratings 118 in the direction of propagation 116 so as support a second resonant mode therebetween.

The acoustic wave in the transducers 104, 106 has a characteristic periodicity and therefore a characteristic wavelength $\lambda_T$. The inner reflective gratings 118 have a characteristic periodicity and therefore a characteristic wavelength $\lambda_{R1}$ while the outer reflective gratings 120 have a characteristic periodicity and therefore a characteristic wavelength $\lambda_{R2}$. Preferably, the periodicity and characteristic wavelengths of the transducers 104, 106, inner reflective gratings 118, and outer reflective gratings 120 are all substantially the same.

In particular, the first gap 122 between the inner reflective gratings 118 and the transducers 104, 106 is chosen to provide synchronous coupling, i.e., the periodicity between the transducers 104, 106 and the inner reflective gratings 118 is preserved. This is done by setting the first gaps to be about $\lambda/2$ in width, although the first gap 122 can be set to be any integer multiple of $n\lambda/2$ in width where n=1, 2, 3, etc..

A novel aspect of the present invention is to provide outer reflective gratings 120 and to choose the second gap 124 between the outer reflective gratings 120 and the inner reflective gratings 118 to provide substantially peak coupling, i.e. shifting the periodicity between the inner and outer reflective gratings 118, 120 by about $\lambda/8$. In particular, the second gap 124 is set to be about $(4m+1)\lambda/8$ in width where m=0, 1, 2, etc.. In other words, the second gap 124 is set to be one of: $\lambda/8$, $5\lambda/8$, $9\lambda/8$, etc.. The introduction of the peak coupled outer reflective gratings 120 provides a second resonant cavity with a second standing wave serving to broaden the bandwidth of the filter 100. Further the peak coupled outer reflective gratings 120 serve to substantially reduce out-of-band spurious frequency modes in the filter 100.

In an alternative embodiment, the periodicities and wavelengths of the transducers 104, 106, inner reflective gratings 118, and outer reflective gratings 120 are varied while maintaining constant gaps 122, 124. For example, the spacings of the electrodes in the gratings 118, 120 may be raised or lowered slightly from the spacings of the electrodes 108, 110 of the input and output transducers 104, 106. This changes the operating frequency of the gratings 118, 120 slightly which broadens the frequency response of the device in addition to minimizing the spurious frequency modes of the device.

In a second alternative embodiment, the periodicities and wavelengths of the transducers 104, 106, inner reflective gratings 118, and outer reflective gratings 120 are varied along with the gaps 122, 124 as stated in the filter embodiment above.

Figure 5:
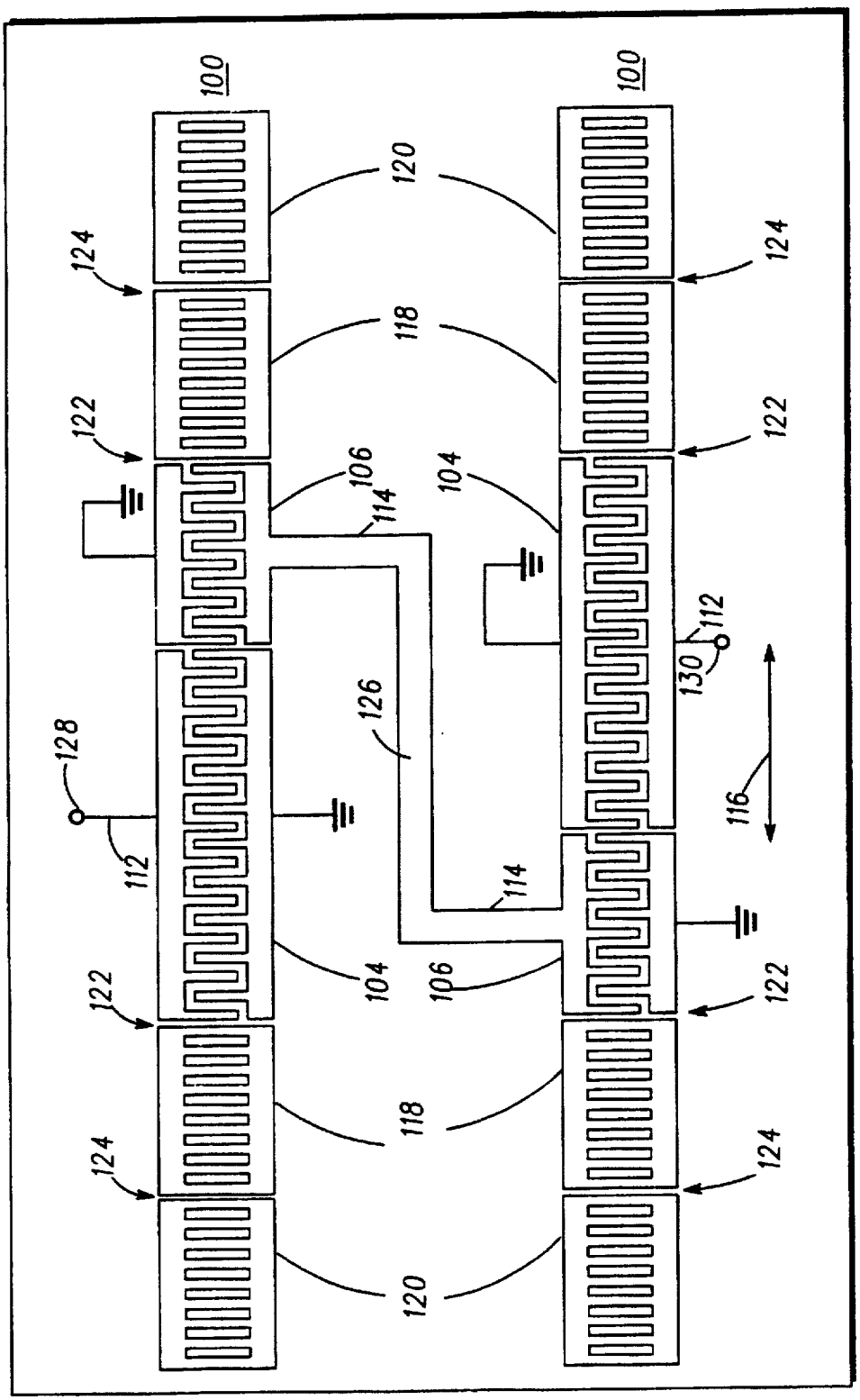
FIG. 5 is a simplified plan view of a preferred embodiment of cascaded acoustic wave filters of FIG. 4, in accordance with the present invention.

FIG. 5 shows a preferred embodiment of the present invention including a cascaded pair of two of the acoustic wave filters 100 of FIG. 4 being electrically coupled to increase desired filtering action. This embodiment effectively provides four-poles of filtering, improving shape factor and doubling out-of-band frequency rejection. In particular, the output transducers 106 of the filters 100 are coupled together. This is accomplished with a transmission line 126 disposed on the upper surface of the substrate 102 at the same time that the filters 100 are disposed on the upper surface of the substrate 102. Preferably the transmission line 126 is impedance matched to the filters 100. In this case, due to the output transducer 106 of both filters 100 being coupled, a terminal 112 of an input transducer 104 of one of the filters serves as an input 128 of the coupled device and a terminal 112 of an input transducer 104 of the other filter 100 serves as an output 130 of the coupled device. Preferably, the filters 100 are similar to the point of being identical with the exception that the filters are doubly-mirrored images of each other. In operation, the inputs and outputs can be reversed because they present identical input impedances to mating circuitry. Also, the transducers 104, 106 are positioned within an acoustic standing wave cavity for maximum coupling energy therebetween.

Figure 6:
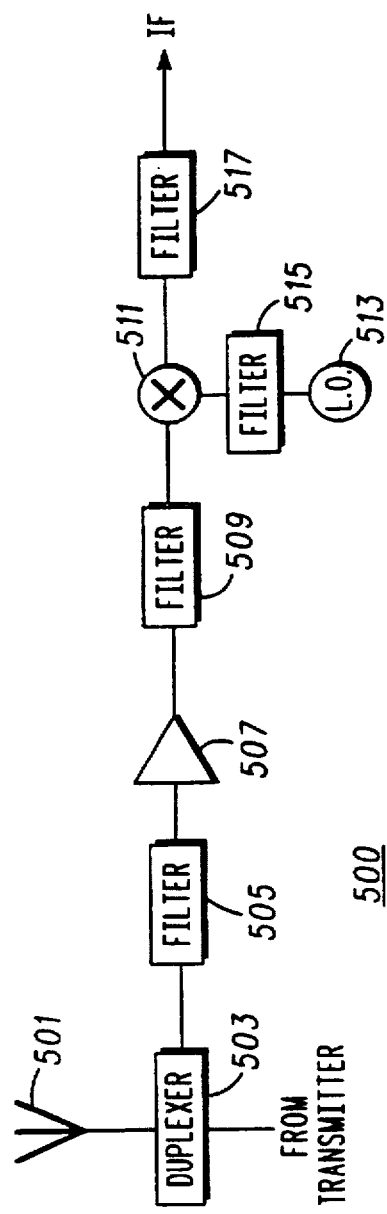
FIG. 6 is a block diagram of a portion of a communication device including acoustic wave filters, in accordance with the present invention.

FIG. 6 is a block diagram of portion 500 of a radio frequency receiver or other communication device including acoustic wave filters, in accordance with the present invention. The portion 500 of the radio apparatus includes an antenna 501, by way of example, used to receive and/or transmit signals. Alternatively, the antenna 501 could be replaced by a fiber-optic link, cable or other signal transmissive media. A diplexer 503 is coupled to the antenna 501 and to a transmitter portion (not shown). The diplexer 503 is a special purpose filter which couples received signals (but not much larger signals from an attached transmitter) to a filter 505. The filter 505 is coupled to an amplifier 507. An output of the amplifier 507 is transmitted to a filter 509 according to the present invention. The filter 509 transmits a signal to a mixer 511. The signal from filter 509 is combined in the mixer 511 with another signal from a local oscillator 513 coupled via a filter 515. An output signal from the mixer 511 is then filtered by a filter 517 to provide an IF output signal. The arrangement of the present invention may be used to provide any or all of the filters 505, 509, 515, 517. An oscillator and filter analogous to the local oscillator 513 and filter 515 may be employed together with a suitable amplifier and modulator to provide the signal "FROM TRANSMITTER" and this filter (known as a "transmit clean-up filter") as well may be provided in accordance with the present invention. Thus, an acoustic filter has been described which overcomes specific problems and accomplishes certain advantages relative to prior art methods and mechanisms. The improvements over known technology are significant. The expense, complexities, and high parts count of prior art cascaded filters are avoided. Further, real input and output impedances are realized for compact, lightweight, adjustment-free filters together with improved design flexibility.

The acoustic wave resonator (as shown in FIG. 3) is provided using a method comprising steps of: providing a piezoelectric substrate for propagating an acoustic wave in a predetermined direction of propagation, disposing at least one transducer including a plurality of interdigitated electrodes being perpendicular to the direction of propagation on the substrate, disposing a pair of inner reflective gratings on either side of the transducer and having the inner reflective gratings being synchronously coupled with the transducer in the direction of propagation, and disposing a pair of outer reflective gratings on either side of a combination of the transducer and pair of inner reflective gratings and having the outer reflective gratings being peak coupled with the combination of the transducer and pair of inner reflective gratings in the direction of propagation.

In particular, the step of disposing a pair of inner reflective gratings includes the pair of inner reflective gratings being separated from the transducer by a first gap of about $n\lambda/2$ acoustic wavelengths where n=1, 2, 3, etc., and wherein the disposing a pair of outer reflective gratings step includes the pair of outer reflective gratings being separated from the combination of the transducer and pair of inner reflective gratings by a second gap of about $(4m+1)\lambda/8$ acoustic wavelengths where m=0, 1, 2, etc..

In a preferred resonator embodiment, the steps of disposing the at least one transducer, the pair of inner reflective gratings and the pair of outer reflective gratings include substeps of disposing the transducer having a periodicity substantially equal to periodicities of the pairs of inner and outer reflective gratings.

Alternatively, the steps of disposing the at least one transducer, the pair of inner reflective gratings and the pair of outer reflective gratings include substeps of disposing the transducer having a periodicity not equal to periodicities of the pairs of inner and outer reflective gratings. The advantage of this alternative embodiment is that more control is provided over spurious frequency modes.

The acoustic wave filter (as shown in FIG. 4) is provided using a method comprising steps of: providing a piezoelectric substrate for propagating an acoustic wave in a predetermined direction of propagation, disposing an input and output transducer each including a plurality of interdigitated electrodes being synchronously coupled and perpendicular to the direction of propagation on the substrate, disposing a pair of inner reflective gratings on either side of the transducers and being synchronously coupled with the transducers in the direction of propagation, and disposing a pair of outer reflective gratings on either side of a combination of the transducers and pair of inner reflective gratings and being peak coupled with the combination of the transducer and pair of inner reflective gratings in the direction of propagation.

In particular, the step of disposing a pair of inner reflective gratings includes the pair of inner reflective gratings being separated from the transducers by a first gap of about $n\lambda/2$ acoustic wavelengths where n=1, 2, 3, etc., and wherein the disposing a pair of outer reflective gratings step includes the pair of outer reflective gratings being separated from the combination of the transducers and pair of inner reflective gratings by a second gap of about $(4m+1)\lambda/8$ acoustic wavelengths where m=0, 1, 2, etc..

In a preferred filter embodiment, the steps of disposing the input and output transducers, the pair of inner reflective gratings and the pair of outer reflective gratings include substeps of disposing the transducers having a periodicity substantially equal to periodicities of the pairs of inner and outer reflective gratings.

Alternatively, the steps of disposing the input and output transducers, the pair of inner reflective gratings and the pair of outer reflective gratings include substeps of disposing the transducers having a periodicity not equal to periodicities of the pairs of inner and outer reflective gratings.

EXAMPLE

A dual-cascaded 4-pole SAW filter device was produced according to the present invention. Referring to FIG. 5, the device included two cascaded filters 100 with double reflective gratings 118, 120 disposed on a substrate 102 of 45° rotated X-cut Z-propagating $Li_2B_4O_7$ (lithium tetraborate). The device exhibited an insertion loss as low as 1.75 dB with no out-of-band spurious frequencies. The number of electrodes in the input transducers 104 was eighty-nine, although an appropriate range of values is from eighty-five to ninety-five. The number of electrodes in the output transducers 106 was fifty-five, although an appropriate range of values is from fifty-one to fifty-nine. The number of shorted electrodes in the inner reflective gratings 118 (those gratings immediately adjacent to the transducers) was fifty, although an appropriate range of values is from forty-four to fifty-six. The number of shorted electrodes in the outer reflective gratings 120 was ten 10, although an appropriate range of values is from eight to fourteen. The spacing (or delay) of the first gap 122 between the transducers 104, 106 and the inner reflective gratings 118 had a synchronous coupling value of $\lambda/2$, although an appropriate range of values is $(n\lambda/2)\pm(\lambda/10)$ (n=1, 2, 3, etc.). The spacing (or delay) of the second gap 124 between the inner reflective gratings 118 and outer reflective gratings 120 had a peak coupling value of $5\lambda/8$, although an appropriate range of values is $((4m+1)\lambda/8)\pm(\lambda/10)$ (m=0, 1, 2, etc.) for a (metal thickness)/$\lambda$ value of 0.015. The aperture of the gratings 118, 120 and transducers 104, 106 had a value of 7$\lambda$. Aluminum was deposited on the substrate to a thickness of 3450 Å. The reflectivity value was about 0.05/electrode based on a thickness/$\lambda$ value of 0.015.

FIG. 7 illustrates a frequency response of a prior art in-line 4-pole acoustic filter having undesirable out-of-band spurious frequency responses 132 which should be recognized as having the potential to interfere with radio communications.

In contrast, FIG. 8 illustrates a frequency response curve for the acoustic wave device of the above Example, in accordance with the present invention. The response shows substantially reduced undesirable out-of-band spurious frequency responses while maintaining a wide bandwidth.

The present invention advantageously provides a reduction in size and weight over prior art acoustic wave filters by the novel utilization of a new piezoelectric material, lithium tetraborate, in conjunction with incorporating transducers having double reflective gratings that are strategically placed with predetermined gaps on a piezoelectric substrate so as to substantially reduce spurious frequencies and provide a wide bandwidth.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. An acoustic wave resonator, comprising:

a piezoelectric substrate having an upper surface;

at least one acoustic transducer including a plurality of interdigitated electrodes disposed on the upper surface, when electrically energized the electrodes causing acoustic waves to propagate in a direction of propagation substantially perpendicular to the interdigitated electrodes;

a pair of inner reflective gratings disposed on either side of the at least one transducer in the direction of propagation and being synchronously coupled to the at least one transducer; and a pair of outer reflective gratings disposed on either side of a combination of the at least one transducer and pair of inner reflective gratings in the direction of propagation and being peak coupled to the combination of the at least one transducer and pair of inner reflective gratings.

2. The resonator of claim 1, wherein each of the interdigitated electrodes have a width of about $\lambda/4$ acoustic wavelengths and are separated from one another by a gap of about $\lambda/4$ acoustic wavelengths.

3. The resonator of claim 2, wherein the substrate is 45° rotated X-cut Z-propagating $Li_2B_4O_7$.

4. The resonator of claim 1, wherein each of the respective pair of outer reflective gratings is separated from the corresponding pair of inner reflective gratings by a second gap of about $(4m+1)\lambda/8$ acoustic wavelengths defining peak coupling where m=0, 1, 2, etc.

5. The resonator of claim 1, wherein the inner and outer reflective gratings comprise a plurality of electrically shorted interdigitated electrodes selected from the group consisting of each electrode having a width greater than $\lambda/4$ acoustic wavelength and being separated from one another by a gap greater than $\lambda/4$ acoustic wavelength, each electrode having a width less than $\lambda/4$ acoustic wavelength and being separated from one another by a gap less than $\lambda/4$ acoustic wavelength, each electrode having a width of about $\lambda/4$ acoustic wavelength and being separated from one another by a gap of about $\lambda/4$ acoustic wavelength.

6. The resonator of claim 1, wherein the outer reflective gratings comprise a plurality of electrically shorted interdigitated electrodes each having a width of about $\lambda/4$ acoustic wavelength and being separated from one another by a gap of about $\lambda/4$ acoustic wavelength.

7. The resonator of claim 1, wherein the electrodes and gratings are of aluminum having a thickness of about 3450 Å.

8. The resonator of claim 1, wherein the substrate is selected from one of the group consisting of ST-cut quartz, 41° rotated Y-cut X-propagating $LiNbO_3$, 64° rotated Y-cut X-propagating $LiNbO_3$, 36° rotated Y-cut X-propagating $LiTaO_3$, and 45° rotated X-cut Z-propagating $Li_2B_4O_7$.

9. The resonator of claim 1, wherein each of the pair of inner reflective gratings is separated from the at least one transducer by a first gap of about $n\lambda/2$ acoustic wavelengths defining synchronous coupling where n=1, 2, 3, etc.

10. An acoustic wave filter, comprising:

a piezoelectric substrate having an upper surface;

an input and an output acoustic transducer each including a plurality of interdigitated electrodes disposed on the upper surface, when electrically energized the interdigitated electrodes of the input transducer generate an acoustic wave propagating in a direction of propagation substantially perpendicular to the electrodes, the output transducer being synchronously coupled with the input acoustic transducer in the direction of propagation and, when acoustically energized by an acoustic wave substantially in the direction of propagation, the interdigitated electrodes of the output transducer generating an electrical output signal;

a pair of inner reflective gratings disposed on either side of the transducers in the direction of propagation, the inner reflective gratings synchronously coupled with the transducers to define a resonant cavity and support a acoustic standing wave therebetween; and a pair of outer reflective gratings disposed on either side of a combination of the transducers and pair of inner reflective gratings in the direction of propagation, the outer reflective gratings peak coupled with the combination to define a second resonant cavity and support a second acoustic standing wave therebetween.

11. The filter of claim 10, wherein each of the interdigitated electrodes of the input and output transducers have a width of about $\lambda/4$ acoustic wavelengths and are separated from one another by a gap of about $\lambda/4$ acoustic wavelengths.

12. The filter of claim 10, wherein each of the pair of inner reflective gratings is separated from the transducer by a first gap of about $n\lambda/2$ acoustic wavelengths where n=1, 2, 3, etc.

13. The filter of claim 10, wherein each of the respective pair of outer reflective gratings is separated from the corresponding pair of inner reflective gratings by a second gap of about $(4m+1)\lambda/8$ acoustic wavelengths where m=0, 1, 2, etc.

14. The filter of claim 10, wherein the inner and outer reflective gratings comprise a plurality of electrically shorted interdigitated electrodes selected from the group consisting of each electrode having a width greater than $\lambda/4$ acoustic wavelength and being separated from one another by a gap greater than $\lambda/4$ acoustic wavelength, each electrode having a width less than $\lambda/4$ acoustic wavelength and being separated from one another by a gap less than $\lambda/4$ acoustic wavelength, each electrode having a width of about $\lambda/4$ acoustic wavelength and being separated from one another by a gap of about $\lambda/4$ acoustic wavelength.

15. The filter of claim 14, wherein the substrate is 45° rotated X-cut Z-propagating $Li_2B_4O_7$.

16. The filter of claim 10, wherein the substrate is selected from one of the group consisting of ST-cut quartz, 41° rotated Y-cut X-propagating $LiNbO_3$, 64° rotated Y-cut X-propagating $LiNbO_3$, 36° rotated Y-cut X-propagating $LiTaO_3$, and 45° rotated X-cut Z-propagating $Li_2B_4O_7$.

17. An acoustic wave device, the device including at least two electrically coupled, cascaded acoustic wave filters, each of the filters comprising:

a piezoelectric substrate having an upper surface;

an input and an output acoustic transducer each including a plurality of interdigitated electrodes disposed on the upper surface, when electrically energized the interdigitated electrodes of the input transducer generate an acoustic wave propagating in a direction of propagation substantially perpendicular to the electrodes, the output transducer being synchronously coupled with the input acoustic transducer in the direction of propagation and, when acoustically energized by an acoustic wave substantially in the direction of propagation, the interdigitated electrodes of the output transducer generating an electrical output signal;

a pair of inner reflective gratings disposed on either side of the transducers in the direction of propagation, the inner reflective gratings synchronously coupled with the transducers to define a resonant cavity and support a acoustic standing wave therebetween; and a pair of outer reflective gratings disposed on either side of a combination of the transducers and pair of inner reflective gratings in the direction of propagation, the outer reflective gratings peak coupled with the combination to define a second resonant cavity and support a second acoustic standing wave therebetween.

18. The device of claim 17, further comprising a substantially impedance matched transmission line coupling the cascaded filters.

19. A method for making an acoustic wave resonator, comprising steps of:

providing a piezoelectric substrate for propagating an acoustic wave in a predetermined direction of propagation;

disposing at least one transducer including a plurality of interdigitated electrodes being perpendicular to the direction of propagation on the substrate;

disposing a pair of inner reflective gratings on either side of the at least one transducer and having the inner reflective gratings being synchronously coupled with the at least one transducer in the direction of propagation; and disposing a pair of outer reflective gratings on either side of a combination of the at least one transducer and pair of inner reflective gratings and having the outer reflective gratings being peak coupled with the combination of the at least one transducer and pair of inner reflective gratings in the direction of propagation.

20. The method of claim 19, wherein the disposing a pair of inner reflective gratings step includes the pair of inner reflective gratings being separated from the at least one transducer by a first gap of about $n\lambda/2$ acoustic wavelengths where n=1, 2, 3, etc., and wherein the disposing a pair of outer reflective gratings step includes the pair of outer reflective gratings being separated from the combination of the at least one transducer and pair of inner reflective gratings by a second gap of about $(4m+1)\lambda/8$ acoustic wavelengths where m=0, 1, 2, etc.

21. The method of claim 19, wherein the steps of disposing the at least one transducer, the pair of inner reflective gratings and the pair of outer reflective gratings include substeps of disposing the at least one transducer having a periodicity substantially equal to periodicities of the pairs of inner and outer reflective gratings.

22. The method of claim 19, wherein the steps of disposing the at least one transducer, the pair of inner reflective gratings and the pair of outer reflective gratings include substeps of disposing the at least one transducer having a periodicity not equal to periodicities of the pairs of inner and outer reflective gratings.

23. A method for making an acoustic wave filter, comprising steps of:

providing a piezoelectric substrate for propagating an acoustic wave in a predetermined direction of propagation;

disposing an input and output transducer each including a plurality of interdigitated electrodes being synchronously coupled and perpendicular to the direction of propagation on the substrate;

disposing a pair of inner reflective gratings on either side of the transducers and being synchronously coupled with the transducers in the direction of propagation; and disposing a pair of outer reflective gratings on either side of a combination of the transducers and pair of inner reflective gratings and being peak coupled with the combination of the transducer and pair of inner reflective gratings in the direction of propagation.

24. The method of claim 23, wherein the disposing a pair of inner reflective gratings step includes the pair of inner reflective gratings being separated from the transducers by a first gap of about $n\lambda/2$ acoustic wavelengths where n=1, 2, 3, etc., and wherein the disposing a pair of outer reflective gratings step includes the pair of outer reflective gratings being separated from the combination of the transducers and pair of inner reflective gratings by a second gap of about $(4m+1)\lambda/8$ acoustic wavelengths where m=0, 1, 2, etc.

25. The method of claim 23, wherein the steps of disposing the input and output transducers, the pair of inner reflective gratings and the pair of outer reflective gratings include substeps of disposing the transducers having a periodicity substantially equal to periodicities of the pairs of inner and outer reflective gratings.

26. The method of claim 23, wherein the steps of disposing the input and output transducers, the pair of inner reflective gratings and the pair of outer reflective gratings include substeps of disposing the transducers having a periodicity not equal to periodicities of the pairs of inner and outer reflective gratings.

27. A radio communication device having at least one acoustic wave filter, the filter comprising:

a piezoelectric substrate having an upper surface;

an input and an output acoustic transducer each including a plurality of interdigitated electrodes disposed on the upper surface, when electrically energized the interdigitated electrodes of the input transducer generate an acoustic wave propagating in a direction of propagation substantially perpendicular to the electrodes, the output transducer being synchronously coupled with the input acoustic transducer in the direction of propagation and, when acoustically energized by an acoustic wave substantially in the direction of propagation, the interdigitated electrodes of the output transducer generating an electrical output signal;

a pair of inner reflective gratings disposed on either side of the transducers in the direction of propagation, the inner reflective gratings synchronously coupled with the transducers to define a resonant cavity and support a acoustic standing wave therebetween; and a pair of outer reflective gratings disposed on either side of a combination of the transducers and pair of inner reflective gratings in the direction of propagation, the outer reflective gratings peak coupled with the combination to define a second resonant cavity and support a second acoustic standing wave therebetween.

* * * * *